(12) United States Patent
Vermeulen et al.

(10) Patent No.: US 10,297,465 B2
(45) Date of Patent: May 21, 2019

(54) SELECTIVE METAL/METAL OXIDE ETCH PROCESS

(71) Applicant: SACHEM, INC., Austin, TX (US)

(72) Inventors: Paul Vermeulen, Eindhoven (NL); Craig Allen, Austin, TX (US)

(73) Assignee: SACHEM, Inc., Austin, TX (US)

( * ) Notice: Subject to any disclaimer, the term of this patent is extended or adjusted under 35 U.S.C. 154(b) by 274 days.

(21) Appl. No.: 15/108,945

(22) PCT Filed: Jan. 13, 2015

(86) PCT No.: PCT/US2015/011130
§ 371 (c)(1),
(2) Date: Jun. 29, 2016

(87) PCT Pub. No.: WO2015/108842
PCT Pub. Date: Jul. 23, 2015

(65) Prior Publication Data
US 2016/0322236 A1  Nov. 3, 2016

Related U.S. Application Data

(60) Provisional application No. 61/927,346, filed on Jan. 14, 2014.

(51) Int. Cl.
*H01L 29/00* (2006.01)
*H01L 21/44* (2006.01)
(Continued)

(52) U.S. Cl.
CPC .............. *H01L 21/44* (2013.01); *C23F 1/34* (2013.01); *C23F 1/36* (2013.01); *C23F 1/38* (2013.01);
(Continued)

(58) Field of Classification Search
CPC ... H01L 21/44; H01L 21/32134; H01L 29/45; H01L 29/66969; H01L 29/7869; C23F 1/34; C23F 1/36; C23F 1/38
See application file for complete search history.

(56) References Cited

U.S. PATENT DOCUMENTS 5,393,386 A * 2/1995 Aoyama ............... C07C 209/68
205/437
2009/0176363 A1  7/2009  Kang et al.
(Continued)

FOREIGN PATENT DOCUMENTS

EP  2234145  9/2010

OTHER PUBLICATIONS

PCT/US2015/011130; PCT International Search Report and Written Opinion of the International Searching Authority dated Mar. 16, 2015.

*Primary Examiner* — Mounir S Amer
*Assistant Examiner* — Alexander Belousov
(74) *Attorney, Agent, or Firm* — Renner, Otto, Boisselle & Sklar, LLP

(57) ABSTRACT

The present invention provides a process for selectively etching molybdenum or titanium relative to a oxide semiconductor film, including providing a substrate comprising a layer of oxide semiconductor and a layer comprising molybdenum or titanium on the layer of oxide semiconductor; preparing the substrate by applying a photoresist layer over the layer comprising molybdenum or titanium, and then patterning and developing the photoresist layer to form an exposed portion of the layer comprising molybdenum or titanium; providing a composition comprising ammonia or ammonium hydroxide, a quaternary ammonium hydroxide and a peroxide; and applying the composition to the exposed portion for a time sufficient to etch and remove the exposed portion of the layer comprising molybdenum or titanium,
(Continued)

wherein the etching selectively removes the molybdenum or titanium relative to the oxide semiconductor.

6 Claims, 2 Drawing Sheets

(51) Int. Cl.
    *C23F 1/34*     (2006.01)
    *C23F 1/36*     (2006.01)
    *C23F 1/38*     (2006.01)
    *H01L 21/3213*     (2006.01)
    *H01L 29/45*     (2006.01)
    *H01L 29/66*     (2006.01)
    *H01L 29/786*     (2006.01)

(52) U.S. Cl.
    CPC ........ *H01L 21/32134* (2013.01); *H01L 29/45* (2013.01); *H01L 29/66969* (2013.01); *H01L 29/7869* (2013.01)

(56) References Cited

U.S. PATENT DOCUMENTS

2010/0320457 A1    12/2010    Matsubara et al.
2011/0230053 A1*    9/2011    Matsuda .................. C23F 1/38
                                                            438/745
2015/0295092 A1*    10/2015    Misaki ................. G02F 1/1368
                                                             257/43

* cited by examiner

Pattern Photoresist

Selectively etch Mo or Ti

SELECTIVE METAL/METAL OXIDE ETCH PROCESS

The present application is a U.S. National Stage Application based on and claiming benefit and priority under 35 U.S.C. § 371 of International Application No. PCT/US2015/011130, filed 13 Jan. 2015, which in turn claims benefit of and priority to U.S. Provisional Application No. 61/927,346, filed 14 Jan. 2014, the entireties of both of which are hereby incorporated by reference into the present application.

TECHNICAL FIELD

The present invention relates to processes for selectively etching metals with respect to oxide semiconductor films. More specifically, the present invention relates to compositions and processes for selectively etching metals such as molybdenum (Mo) and titanium (Ti) with respect to oxide semiconductor films such as indium-gallium-zinc oxide (IGZO).

BACKGROUND

Oxide semiconductors are of prime interest as alternatives to amorphous silicon TFT channel materials for the use in active matrix panels for display applications. In particular, the high field-effect mobility and low threshold voltage compared to amorphous silicon make oxide semiconductors attractive alternatives. One of the most promising oxide materials is amorphous indium-gallium-zinc-oxide (a-IGZO, or simply IGZO, which is $InGaO_3(ZnO)_5$) that has been shown to have superior electrical properties compared to amorphous silicon and no uniformity drawbacks that are typically found for polycrystalline Si. IGZO has high mobility, electrical stability, and excellent uniformity. Other transparent conductive films, such as indium tin zinc oxide (ITZO) (actually, amorphous $In_2O_3$—$SnO_2$—$ZnO$ (a-ITZO)) have been applied particularly in the field of thin film displays in TFTs, as the active layer. Since such amorphous oxide semiconductor films, in particular IGZO and ITZO, can be formed on a polymer film at relatively low temperatures, they have been applied to light-weight portable electronic items using such thin film displays.

There are four basic TFT structures, including bottom-gate staggered, top-gate staggered, bottom-gate coplanar and top-gate coplanar. In such a TFT, the source and drain may be formed of a thin metal film, from a metal such as Al or Cu or alloys of these metals. Mo has been used in the past as the source/drain, but for the future devices, the more conductive metals Al and Cu are planned. However, if Al or Cu are applied in direct contact with IGZO or ITZO films, problems can arise, such as diffusion of Cu into the IGZO or ITZO or creation of additional vacancies in the IGZO or ITZO by reaction of the Al with oxygen from the IGZO or ITZO. Thus, in most cases, a thin film of Mo or Ti is provided and the more conductive Al or Cu or alloys thereof is used as the primary conductor. The layer of Mo or Ti separates the Al or Cu from the oxide semiconductor, thus avoiding these problems. This thin metal film is formed on the IGZO or ITZO, thus forming a metal composite layer on the IGZO or ITZO, e.g., of Mo/Cu/Mo/IGZO, Mo/Al/Mo/IGZO, Cu/Mo/IGZO, Mo/IGZO, Al/Mo/IGZO. In the foregoing composites, Ti may replace Mo. To form the TFT structure, a layer of the thin metal film, Mo/Cu/Mo, Mo/Al/Mo, Cu/Mo, Mo, Al/Mo (again, Ti may replace Mo), that has been formed must be etched to form the separate source and drain. In order to etch the thin metal film and not etch away the oxide semiconductor film, it is necessary that the etchant have a high selectivity for the metals relative to the oxide semiconductor film. Dry etchants have been used, but have poor selectivity and tend to damage the underlying oxide semiconductor film. Commonly used wet etchants, such as PAN, have shown poor selectivity for metal(s) relative to the underlying semiconductor oxide films. Other etchants such as ammonia/peroxide, have been found to lack reproducibility, consistency and sufficient selectivity for etching the metal(s) relative to the oxide semiconductor film. The most important problem is the selectivity of the etchant for the "bottom" metal in the stack, e.g., Mo or Ti, with respect to the oxide semiconductor, e.g., IGZO or ITZO, and this problem has remained unsolved.

Thus, there is a continuing need for etchants that can provide reliable and consistent high etching selectivity for the metal(s) relative to the underlying oxide semiconductor film.

SUMMARY

The present inventors have discovered that a combination of quaternary ammonium hydroxide, ammonia or ammonium hydroxide and hydrogen peroxide provides excellent, fast etching with a very high selectivity for the metal, e.g., molybdenum (Mo) or titanium (Ti), relative to the oxide semiconductor film. Although not to be bound by theory, it is considered that the quaternary ammonium hydroxide provides some degree of protection to the oxide semiconductor, while improving the etching of the layer comprising a metal, e.g., comprising molybdenum or titanium, relative to a oxide semiconductor film.

In one embodiment, the present invention relates to a process for selectively etching a molybdenum or titanium film relative to a oxide semiconductor film, comprising:

providing a substrate comprising a layer of oxide semiconductor and a layer comprising molybdenum or titanium on the layer of oxide semiconductor;

preparing the substrate by applying a photoresist layer over the layer comprising molybdenum or titanium, and then patterning and developing the photoresist layer to form an exposed portion of the layer comprising molybdenum or titanium;

providing a composition comprising ammonia or ammonium hydroxide, a quaternary ammonium hydroxide and a peroxide; and applying the composition to the exposed portion for a time sufficient to etch and remove the exposed portion of the layer comprising molybdenum or titanium, wherein the etching selectively removes the molybdenum or titanium relative to the oxide semiconductor.

In another embodiment, the present invention relates to a process for forming a transistor, comprising:

forming a channel layer of a oxide semiconductor;

depositing a source/drain layer comprising molybdenum or titanium over the channel layer;

applying a photoresist layer over the layer comprising molybdenum or titanium, and then patterning and developing the photoresist layer to form an exposed portion of the layer comprising molybdenum or titanium;

providing a composition comprising ammonia or ammonium hydroxide, a quaternary ammonium hydroxide and a peroxide; and applying the composition to the exposed portion for a time sufficient to etch and remove the exposed portion of the layer comprising molybdenum or titanium, wherein the etching selectively removes the molybdenum or titanium relative to oxide semiconductor, to form a source and a drain for the transistor.

The present invention thus addresses the need in the art for effective etching and removal of at least one of molybdenum or titanium relative to a oxide semiconductor film on which the molybdenum or titanium is located.

Figure 1:
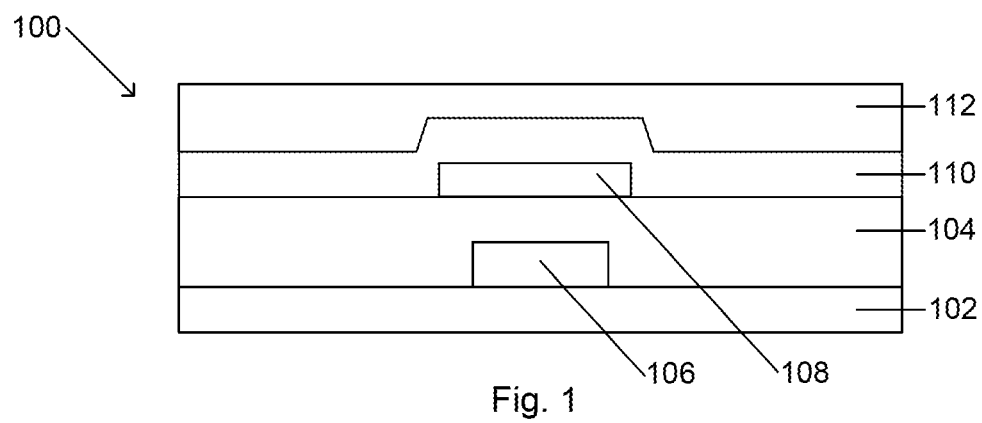
FIG. 1 is a schematic cross-sectional view of a portion of a semiconductor device prior to patterning of a photoresist layer on the device.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding or same elements.

DETAILED DESCRIPTION

It should be appreciated that the process steps and structures described herein do not form a complete system or process flow for carrying out an etching process, such as would be used in manufacturing a semiconductor device or TFT display device. The present invention can be practiced in conjunction with fabrication techniques and apparatus currently used in the art, and only so much of the commonly practiced materials, apparatus and process steps are included as are necessary for an understanding of the present invention.

Throughout the disclosure and claims, the numerical limits of the disclosed ranges and ratios may be combined, and all intervening values are deemed to be disclosed by the disclosure of the ranges. Furthermore, all numerical values are deemed to be preceded by the modifier Aabout@, whether or not this term is specifically stated. Throughout the disclosure and claims, any member of a group may be deleted from the group. Throughout the disclosure and claims, all possible combinations of the various disclosed elements may be combined, and all such combinations are deemed to be included within the scope of the present invention. Throughout the disclosure and claims, unless specifically stated otherwise, reference to "a", "an", and/or "the" may include one or more than one, and that reference to an item in the singular may also include the item in the plural. Throughout the disclosure and claims, unless otherwise specified all temperatures are measured in degrees Celsius, all processes are conducted at room or ambient temperature, all pressures are atmospheric.

Certain of the embodiments of the invention briefly described in the foregoing Summary are described in more detail in the following written description so as to enable a person of skill in the art to make and use the invention.

In the process according to the present invention, etching can be carried out to form a source and a drain from a metal layer or layers deposited directly on an IGZO layer or other transparent semiconductor oxide material, by selectively etching away the metal layer(s) without the need for an etch stop layer and without damage to the IGZO or other transparent semiconductor oxide layer. The metal layers include, for example, Mo/Cu/Mo, Mo/Al/Mo, Cu/Mo, Mo, Al/Mo, alloys of any of Mo, Cu and Al replacing any of the corresponding metals, and similar metals known in the art for use as source/drain conductors for TFTs.

FIG. 1 is a schematic cross-sectional view of a portion of a semiconductor device 100 prior to patterning of a photoresist layer 112. As shown in FIG. 1, the device 100 includes a substrate 102, formed of, e.g., glass for a TFT display device, an insulator layer 104, a gate 106, a channel layer 108, a metal layer 110 that will be etched to form a source and a drain, and the photoresist layer 112. In one embodiment, the channel conductor 108 is an oxide semiconductor, such as IGZO or ITZO. In one embodiment, the metal layer 110 comprises molybdenum (Mo) or titanium (Ti), a layer of aluminum (Al) on Mo or Ti, a sandwich of Mo/Al/Mo or of Ti/Al/Ti, a layer of copper (Cu) on Mo or Ti, a sandwich of Mo/Cu/Mo or of Ti/Cu/Ti, or alloys of any of these metals in the same structures. As used herein, "alloys of any of these metals" includes any known alloys of any one of Mo, Ti, Cu or Al known for use in semiconductor devices. As illustrated in FIG. 1, the photoresist layer 112 has been applied but has not yet been patterned.

Figure 2:
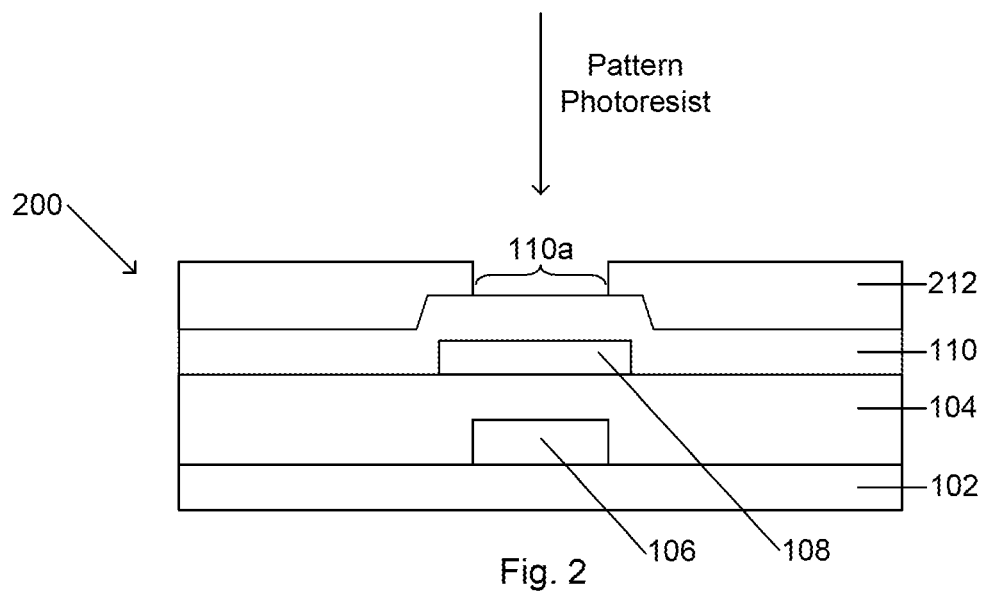
FIG. 2 is a schematic cross-sectional view of a portion of a semiconductor device after patterning of a photoresist layer prior to etching in accordance with the invention.

FIG. 2 is a schematic cross-sectional view of a portion of a semiconductor device 200 after patterning of the photoresist layer 112 of FIG. 1, in which the photoresist layer 212 has been patterned to form an opening at an appropriate location, to form an exposed portion 110a of the metal layer 110, for subsequent etching to form a source and a drain for the nascent TFT, prior to the etching, in accordance with an embodiment of the invention.

Figure 3:
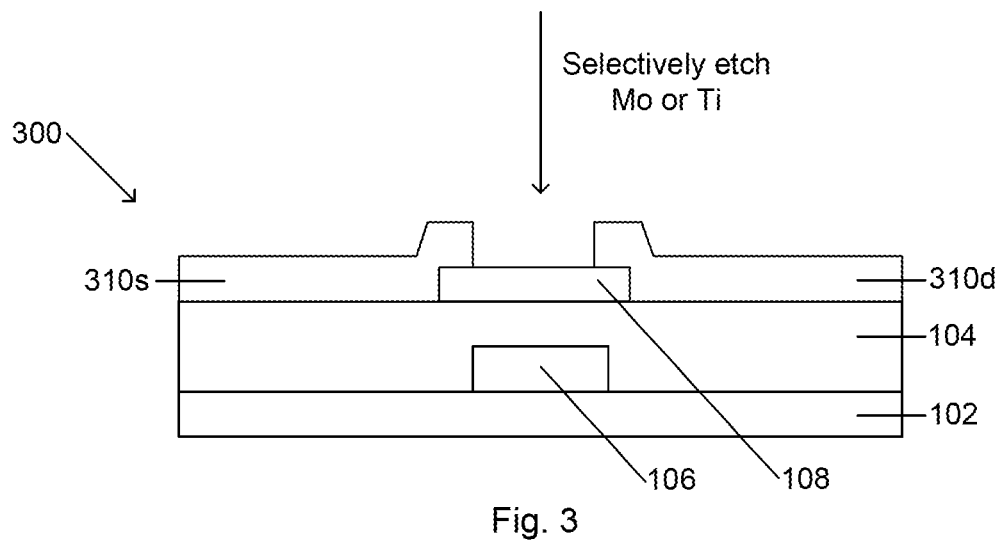
FIG. 3 is a schematic cross-sectional view of a portion of a semiconductor device after etching in accordance with the invention.

FIG. 3 is a schematic cross-sectional view of a portion of a semiconductor device, e.g., a thin film transistor, 300, after etching in accordance with the invention. As shown in FIG. 3, the exposed portion 110a of the metal layer 110 has been etched to form a source 310s and a drain 310d. At the point in the process shown in FIG. 3, the photoresist 212 has been removed. In accordance with embodiments of the present invention, the channel layer 108, made of an oxide semiconductor such as IGZO, has not been etched to any significant degree, as a result of the highly selective etch process of the present invention.

Figure 4:
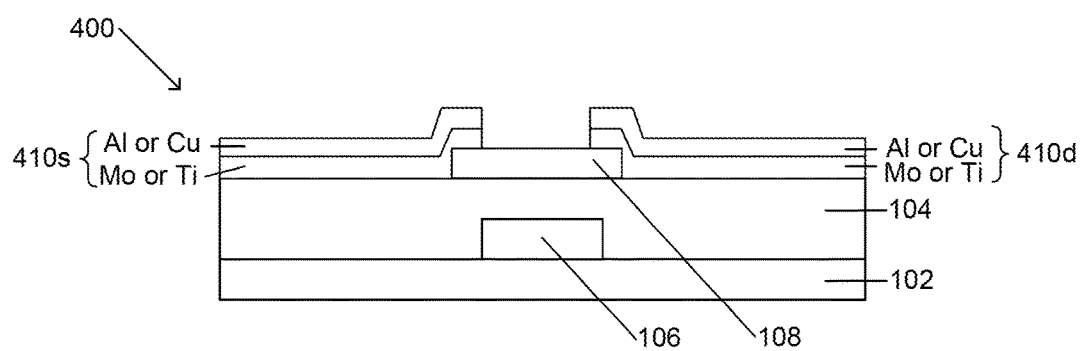
FIGS. 4 and 5 are schematic cross-sectional views of embodiments of the layer comprising molybdenum or titanium, illustrating compound or sandwiched metal layers on the layer comprising molybdenum or titanium.
Figure 5:
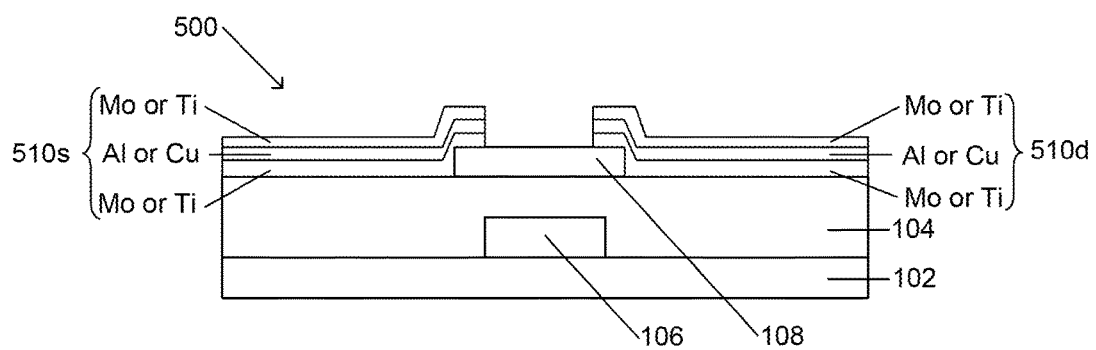

FIGS. 4 and 5 are schematic cross-sectional views of additional embodiments of the metal layer 110, illustrating compound or sandwiched metal layers on the layer comprising molybdenum or titanium. In this regard, it is noted that in the embodiment illustrated in FIGS. 1-3, the layer comprising molybdenum or titanium is a single material, e.g., Mo or an alloy of Mo, or Ti or an alloy of Ti. As disclosed herein, in other embodiments, the layer comprising molybdenum or titanium (or an alloy thereof), may further comprise a layer of aluminum or copper on the Mo layer, and in yet other embodiments, a further layer of Mo may overlay the layer of aluminum or copper on the first Mo layer, forming a sandwich structure, Mo/Al/Mo or Mo/Cu/Mo.

FIG. 4 illustrates an embodiment 400 in which the layer comprising molybdenum or titanium further comprises, formed on the layer of molybdenum or titanium, an additional layer of either Al or Cu. Thus, as shown in FIG. 4, there is formed a source 410s and a drain 410d, each of which include a layer of molybdenum or titanium on and in contact with an underlying layer 108 of an oxide semiconductor, and, on or over the layer of molybdenum or titanium, an additional layer of either Al or Cu. Thus, in one embodiment, the layer 110 comprising molybdenum or titanium further comprises a layer of aluminum or a layer of copper on the layer of molybdenum or titanium, which will become the source and drain, on the layer of oxide semiconductor.

FIG. 5 illustrates an embodiment 500 in which the layer comprising molybdenum or titanium further comprises, formed on the layer of molybdenum or titanium, an additional layer of either Al or Cu, and, on the additional layer of either Al or Cu, a further layer of molybdenum or titanium. Thus, as shown in FIG. 5, there is formed a source 510s and a drain 510d, each of which include a layer of molybdenum or titanium on and in contact with an underlying layer 108 of an oxide semiconductor, and, on or over the layer of molybdenum or titanium, an additional layer of either Al or Cu, and, on or over the additional layer of Al or Cu, a further layer of Mo. Thus, in one embodiment, the layer 110 comprising molybdenum or titanium further comprises a second layer of molybdenum or titanium on the layer of aluminum or on the layer of copper on the layer of molybdenum or titanium, thereby forming a Mo/Al/Mo sandwich or a Mo/Cu/Mo sandwich, or a Ti/Al/Ti sandwich or a Ti/Cu/Ti sandwich, which will become the source and drain.

Thus, in accordance with embodiments of the present invention, there is provided a process for selectively etching molybdenum or titanium relative to a oxide semiconductor film, including the steps of:

providing a substrate 102 comprising a layer of oxide semiconductor 108 and a layer 110 comprising molybdenum or titanium on the channel layer 108 of oxide semiconductor;

preparing the substrate by applying a photoresist layer 112 over the layer 110 comprising molybdenum or titanium, and then patterning and developing the photoresist layer 112 to form an exposed portion 110a of the layer 110 comprising molybdenum or titanium;

providing a composition comprising ammonia or ammonium hydroxide, a quaternary ammonium hydroxide and a peroxide;

applying the composition to the exposed portion 110a for a time sufficient to etch and remove the exposed portion 110a of the layer comprising molybdenum or titanium, wherein the etching selectively removes the molybdenum or titanium relative to the oxide semiconductor of the channel layer 108.

In other embodiments, the present invention provides a process for forming a transistor 300, comprising:

forming a channel layer 108 of a oxide semiconductor;

depositing a source/drain layer 110 comprising molybdenum or titanium on the channel layer 108;

applying a photoresist layer 112 over the layer 110 comprising molybdenum or titanium, and then patterning and developing the photoresist layer 110 to form an exposed portion 110a of the layer 110 comprising molybdenum or titanium;

providing a composition comprising ammonia or ammonium hydroxide, a quaternary ammonium hydroxide and a peroxide;

applying the composition to the exposed portion 110a for a time sufficient to etch and remove the exposed portion 110a of the layer 110 comprising molybdenum or titanium, wherein the etching selectively removes the molybdenum or titanium relative to the oxide semiconductor, to form a source 310s and a drain 310d for the transistor 300.

In one embodiment, the selective etch removes substantially all of the exposed portion 110a of the layer 110 comprising molybdenum or titanium and substantially none of the layer 108 of oxide semiconductor.

In one embodiment, the selective etch exhibits a metal/oxide semiconductor selectivity of at least 6:1. In another embodiment, the selective etch exhibits a metal/oxide semiconductor selectivity of at least 20:1. In another embodiment, the selective etch exhibits a metal/oxide semiconductor selectivity of at least 100:1. In another embodiment, the selective etch exhibits a metal/oxide semiconductor selectivity of at least 250:1. In another embodiment, the selective etch exhibits a metal/oxide semiconductor selectivity of at least 2500:1. In another embodiment, the selective etch exhibits a metal/oxide semiconductor selectivity of about 3000:1. Since the limits of the ranges and ratios may be combined, the foregoing includes, for example, a selectivity in the range from about 100:1 to about 3000:1, and similar combinations.

In one embodiment, the composition comprises:
2-10 wt. % ammonia, and in one embodiment 1-10 wt. % ammonia;
0.01-0.5 M quaternary ammonium hydroxide; and
0.1-7 wt % hydrogen peroxide.

In one embodiment, the composition comprises:
3-10 wt. % ammonia;
0.01-0.5 M quaternary ammonium hydroxide; and
0.1-7 wt % hydrogen peroxide.

In one embodiment, the composition comprises:
6-8 wt. % ammonia;
0.05-0.2 M quaternary ammonium hydroxide; and
0.5-2 wt % hydrogen peroxide.

In one embodiment, the composition comprises:
7 wt. % ammonia;
0.1 M quaternary ammonium hydroxide; and
1 wt % hydrogen peroxide.

In one embodiment, the peroxide is present in less than a major amount, i.e., less than 50% of the added agents, excluding the solvent, e.g., water.

EXAMPLES

In an initial set of tests, the comparative etch rate of Mo in various combinations of TMAH and ammonia in aqueous solutions containing 1 wt. % hydrogen peroxide are tested, and it is found that the rate of Mo etching is high at low concentrations of TMAH, and appears to be dependent upon the concentration of ammonia in the etching composition. In these tests, for the TMAH in Aqueous $NH_3$ samples in Table 1, the etching times are 10, 20, 30 and 60 seconds and for the $NH_3$ in Aqueous TMAH samples in Table 2, the etching times are 1, 2, 5, 10 and 20 minutes in solution no. 6, and 10, 20, 30, 60 seconds and 2, 5 and 10 minutes in solution nos. 7-10.

TABLE 1

TMAH in Aqueous $NH_3$

| Ex. No. | TMAH (M) | $NH_3$ (wt. %) | $H_2O_2$ (wt. %) | pH | Mo etch rate (Å/min) |
|---|---|---|---|---|---|
| 1 | 0 | 7 | 1 | 12 | 5853 |
| 2 | 0.001 | 7 | 1 | 12 | 5860 |
| 3 | 0.01 | 7 | 1 | 12.1 | 5831 |
| 4 | 0.1 | 7 | 1 | 13 | 5737 |

TABLE 1-continued

TMAH in Aqueous NH$_3$

| Ex. No. | TMAH (M) | NH$_3$ (wt. %) | H$_2$O$_2$ (wt. %) | pH | Mo etch rate (Å/min) |
|---|---|---|---|---|---|
| 5 | 0.5 | 7 | 1 | 13.7 | 1556 |
| 5A | 1.0 | 7 | 1 | 14 | 260 |

The optimum Mo etch composition is considered to be that in Example No. 4.

TABLE 2

NH$_3$ in Aqueous TMAH

| Ex. No. | TMAH (M) | NH$_3$ (wt. %) | H$_2$O$_2$ (wt. %) | pH | Mo etch rate (Å/min) |
|---|---|---|---|---|---|
| 6 | 0.5 | 0 | 1 | 13.7 | 179 |
| 7 | 0.5 | 1 | 1 | 13.7 | 294 |
| 8 | 0.5 | 2 | 1 | 13.7 | 464 |
| 9 | 0.5 | 4 | 1 | 13.7 | 768 |
| 10 | 0.5 | 7 | 1 | 13.7 | 1556 |

In a second set of tests, the Mo/IGZO selectivity is determined in various combinations of TMAH and ammonia in aqueous solutions containing 1 wt. % hydrogen peroxide, as shown in the following Table 3. In these tests, it is found that the best selectivity is obtained with the same etchant as in Ex. No. 4, that the zero TMAH sample corresponds to Ex. No. 1, and that the 0.5 M TMAH sample corresponds to Ex. No. 6, respectively, in Table 1 above.

TABLE 3

Etch Selectivity Mo/IGZO

| TMAH(M) | NH$_3$ (wt. %) | H$_2$O$_2$ (wt. %) | pH | IGZO etch rate (Å/min) | Mo etch rate (Å/min) | Etch selectivity IGZO:Mo |
|---|---|---|---|---|---|---|
| 0 | 7 | 1 | 12 | 900 | 5853 | 1:6.5 |
| 0.1 | 7 | 1 | 13 | 2 | 5737 | 1:2870 |
| 0.5 | 0 | 1 | 13.7 | 3 | 190 | 1:63 |

In a third set of tests, the effects of quaternary ammonium and ammonia on the Mo etch rate are determined. For these tests, a 200 nm thick layer of Mo is sputtered onto a silicon wafer, and the Mo etching is estimated by measuring sheet resistivity after etching at 40° C. (Table 4) and 20° C. (Tables 5 and 6). The following results are obtained, first using only aqueous ammonia and hydrogen peroxide, as shown in the following Tables 4 and 5, and then using aqueous TMAH and hydrogen peroxide, as shown in the following Table 6.

TABLE 4

Aqueous NH$_3$ and Varied Peroxide at 40° C.

| Ex. No. | NH$_3$ (wt. %) | H$_2$O$_2$ (wt. %) | H$_2$O (wt. %) | pH | Mo etch rate (Å/min) |
|---|---|---|---|---|---|
| 11 | 7 | 1.5 | 91.5 | 11.93 | >12000 |
| 12 | 7 | 10.0 | 83 | 11.93 | >12000 |
| 13 | 7 | 5.0 | 88 | 11.93 | >12000 |
| 14 | 7 | 1.0 | 92 | 11.93 | >12000 |
| 15 | 7 | 0 | 93 | 11.93 | 0 |
| 16 | TMAH | 0 | | 11.93 | 0 |

As shown in Table 4, after just 10 seconds the sheet resistivity of the samples with H$_2$O$_2$ was in the order of 60 Ω/sq, which corresponds to nearly completely etched layer. The solutions without H$_2$O$_2$ did not show variation of the sheet resistivity, therefore these layers are considered to not have been etched at all within the etching time.

TABLE 5

Aqueous NH$_3$ with Varying Peroxide at 20° C.

| Ex. No. | NH$_3$ (wt. %) | H$_2$O$_2$ (wt. %) | H$_2$O (wt. %) | pH | Mo etch rate (Å/min) |
|---|---|---|---|---|---|
| 17 | 7 | 0 | 93 | 11.9 | 0 |
| 18 | 7 | 0.1 | 92.9 | 11.9 | 600 |
| 19 | 7 | 1.00 | 92 | 11.9 | 5660 |
| 20 | 7 | 5.00 | 88 | 11.9 | >12000 |

As shown in Table 5, at 20° C. the Mo etch rate can be determined qualitatively, except for the solution with 5 wt % H$_2$O$_2$ as the layer is completely etched after 10 seconds. The results show that increasing the H$_2$O$_2$ concentration increases the Mo etch rate, just as one would expect based on the increasing oxidizing strength when adding an oxidizing agent.

TABLE 6

Aqueous TMAH and Peroxide at 20° C.

| Ex. No. | TMAH (M) | H$_2$O$_2$ (wt. %) | pH | Mo etch rate (Å/min) |
|---|---|---|---|---|
| 21 | 8.50E-3 | 0 | 11.9 | 0 |
| 22 | 8.50E-3 | 0.01 | 11.9 | 0 |
| 23 | 8.50E-3 | 0.10 | 11.9 | 13.0 |
| 24 | 8.50E-3 | 1.00 | 11.9 | 1350 |
| 25 | 8.50E-3 | 5.00 | 11.9 | 3900 |

The results in Table 6 show that increasing the H$_2$O$_2$ concentration increases the Mo etch rate, just as one would expect based on the increasing oxidizing strength when adding an oxidizing agent. Comparing the NH$_3$ and TMAH solutions, the NH$_3$ solutions have a higher Mo etch rate.

In a fourth set of tests, a number of different quaternary ammonium hydroxides are tested to determine Mo etch rate at two different concentrations of the quaternary ammonium hydroxides. For these tests, a 200 nm thick layer of Mo is sputtered onto a silicon wafer, and the Mo etching is estimated by measuring sheet resistivity after etching at 20° C. The following results are obtained, as shown in Tables 7 and 8.

TABLE 7

Effect of Different Quaternary Ammoniums on Mo Etch Rate

| Ex. No. | Quaternary Ammonium | QOH (M) | NH$_3$ (wt. %) | H$_2$O$_2$ (wt. %) | pH | Mo etch rate (Å/min) |
|---|---|---|---|---|---|---|
| 26 | TMAH | 0.1 | 7 | 1 | 13 | 5737 |
| 27 | TEAH | 0.1 | 7 | 1 | 13 | 5760 |
| 28 | DMDP | 0.1 | 7 | 1 | 13 | 5580 |
| 29 | BnTMAH | 0.1 | 7 | 1 | 13 | 5601 |
| 30 | AdamantylTMAH | 0.1 | 7 | 1 | 13 | 5541 |
| 31 | ETMAH | 0.1 | 7 | 1 | 13 | 5416 |

TMAH = Tetramethylammonium hydroxide
TEAH = Tetraethylammonium hydroxide
DMDP = Dimethyldipropylamminium hydroxide
BnTMAH = Benzyl trimethylammonium hydroxide
AdamantylTMAH = Adamantyl trimethylammonium hydroxide
ETMAH = Ethyltrimethylammonium hydroxide As shown in Table 7, at 0.1 M QOH, 7 wt. % NH$_3$ and 1 wt. % H$_2$O$_2$ the Mo etch rate is not affected by the molecular structure of the quaternary ammonium cation, being high in all cases.

TABLE 8

Effect of Different Quaternary Ammoniums on Mo Etch Rate

| Ex. No. | Quaternary Ammonium | QOH (M) | NH$_3$ (wt. %) | H$_2$O$_2$ (wt. %) | pH | Mo etch rate (Å/min) |
|---|---|---|---|---|---|---|
| 32 | TMAH | 0.5 | 7 | 1 | 13.7 | 1556 |
| 33 | TEAH | 0.5 | 7 | 1 | 13.7 | 914 |
| 34 | DMDP | 0.5 | 7 | 1 | 13.7 | 462 |
| 35 | BnTMAH | 0.5 | 7 | 1 | 13.7 | 632 |
| 36 | AdamantylTMAH | 0.5 | 7 | 1 | 13.7 | 517 |
| 37 | ETMAH | 0.5 | 7 | 1 | 13.7 | 636 |

As shown in Table 8, at 0.5 M QOH, 7 wt. % NH$_3$ and 1 wt. % H$_2$O$_2$ the Mo etch rate is affected by the molecular structure of the quaternary ammonium cation.

In a further set of tests, two additional quaternary ammonium hydroxides are tested in Mo etching, with varying concentrations of the hydroxide and ammonia. The results are shown in Table 9.

TABLE 9

Effect of Different Quaternary Ammoniums and Different Ammonia Concentrations on Mo Etch Rate

| Ex. No. | Quaternary Ammonium | QOH (M) | NH$_3$ (wt. %) | H$_2$O$_2$ (wt. %) | pH | Mo etch rate (Å/min) |
|---|---|---|---|---|---|---|
| 38 | Choline OH | 0.1 | 7 | 1 | 13 | 5579 |
| 39 | Choline OH | 0.5 | 0 | 1 | 13.7 | 197 |
| 40 | Choline OH | 0.5 | 4 | 1 | 13.7 | 391 |
| 41 | Choline OH | 0.5 | 7 | 1 | 13.7 | 648 |
| 42 | TBAH | 0.1 | 7 | 1 | 13 | 5328 |
| 43 | TBAH | 0.5 | 0 | 1 | 13.7 | 65 |
| 44 | TBAH | 0.5 | 7 | 1 | 13.7 | 773 |

TBAH = tetrabutylammonium hydroxide
Choline OH = trimethylethanolammonium hydroxide As shown in Table 9, the highest Mo etch rate is obtained with 0.1 M quaternary ammonium hydroxide, 7 wt % ammonia, and 1 wt % hydrogen peroxide. As observed with other tests, Mo etch rate is independent of the cation at these concentrations, but a higher concentration of the quaternary ammonium hydroxide or lower concentration of ammonia reduces the Mo etch rate.

In another set of tests, the copper etch rate is determined using 0.1 M TMAH, 1 wt % hydrogen peroxide and either 0 or 7 wt % ammonia. The results obtained are shown in Table 10.

TABLE 10

Cu Etch Rate

| Ex. No. | Quaternary Ammonium | QOH (M) | NH$_3$ (wt. %) | H$_2$O$_2$ (wt. %) | pH | Cu etch rate (Å/min) |
|---|---|---|---|---|---|---|
| 45 | TMAH | 0.1 | 0 | 1 | 13 | 0 |
| 46 | TMAH | 0.1 | 7 | 1 | 13 | 22600 |
| 47 | TMAH | 0.5 | 0 | 1 | 13.7 | 0 |
| 48 | TMAH | 0.5 | 7 | 1 | 13.7 | 22600 |

As shown in Table 10, Cu etches extremely quickly with solutions that contain 7 wt. % NH$_3$. The etch rate is so high that within a few seconds a 200 nm thick Cu layer is completely etched.

In another set of tests, the aluminum etch rate is determined using 0.1 M TMAH, 1 wt % hydrogen peroxide and either 0 or 7 wt % ammonia. The results obtained are shown in Table 11.

TABLE 11

Al Etch Rate

| Ex. No. | Quaternary Ammonium | QOH (M) | NH$_3$ (wt. %) | H$_2$O$_2$ (wt. %) | pH | Al etch rate (Å/min) |
|---|---|---|---|---|---|---|
| 49 | TMAH | 0.1 | 0 | 1 | 13 | 275 |
| 50 | TMAH | 0.1 | 7 | 1 | 13 | 315 |
| 51 | TMAH | 0.5 | 0 | 1 | 13.7 | 880 |
| 52 | TMAH | 0.5 | 7 | 1 | 13.7 | 880 |

As shown in Table 11, the Al etch rate increases for etchants with a higher concentration of TMAH. At 0.1 M TMAH the addition of NH$_3$ increases the etch rate, whereas at 0.5 M TMAH the Al etch rate is unaffected by the NH$_3$ concentration. This appears to suggest that, at 0.5 M TMAH, the etch rate is reduction rate dependent and the oxidation rate does not limit the overall etch rate. At 0.1 M it appears to be exactly the opposite, where the addition of NH$_3$, which is known to be a good complexing agent, might increase the oxidation rate and is therefore oxidation rate dependent.

In another set of tests, the titanium etch rate is determined using 0 or 0.1 M TMAH, 16.67 or 6.67 wt % hydrogen peroxide and 6.44 wt % ammonia. The results obtained are shown in Table 12.

TABLE 12

Ti Etch Rate

| Ex. No. | Quaternary Ammonium | QOH (M) | NH$_3$ (wt. %) | H$_2$O$_2$ (wt. %) | pH | Ti etch rate (Å/min) |
|---|---|---|---|---|---|---|
| 53 | TMAH | 0 | 6.44 | 16.67 | 11.9 | 495 |
| 54 | TMAH | 0 | 6.44 | 6.67 | 13 | 246 |
| 55 | TMAH | 0.1 | 6.44 | 6.67 | 13.7 | 256 |

As shown in Table 12, the Ti etch rate is actually higher when no quaternary ammonium hydroxide is present with a high concentration of hydrogen peroxide, and when the hydrogen peroxide concentration is lower, the Ti etch rate is the same with our without the quaternary ammonium hydroxide. However, given that the presence of the quaternary ammonium hydroxide has shown a protective effect for the IGZO, it appears that Ti can be effectively and selectively etched away, and that the selectivity shown by the present invention can be obtained when etching and removing a Ti layer on IGZO.

While the principles of the invention have been explained in relation to certain particular embodiments, which are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the appended claims.

The invention claimed is:

1. A process for selectively etching molybdenum or titanium relative to a oxide semiconductor film, comprising:
   providing a substrate comprising a layer of oxide semiconductor and a layer comprising molybdenum or titanium on the layer of oxide semiconductor;

preparing the substrate by applying a photoresist layer over the layer comprising molybdenum or titanium, and then patterning and developing the photoresist layer to form an exposed portion of the layer comprising molybdenum or titanium;

providing a composition comprising ammonia or ammonium hydroxide, a quaternary ammonium hydroxide and a peroxide; and applying the composition to the exposed portion for a time sufficient to etch and remove the exposed portion of the layer comprising molybdenum or titanium, wherein the etching selectively removes the molybdenum or titanium relative to the oxide semiconductor, wherein the composition comprises:
3-10 wt. % ammonia;
0.01-0.5 M quaternary ammonium hydroxide; and
0.1-7 wt % hydrogen peroxide.

2. The process according to claim 1 wherein the selective etch removes substantially all of the exposed portion of the layer comprising molybdenum or titanium and substantially none of the layer of oxide semiconductor.

3. The process according to claim 1 wherein the selective etch exhibits a metal/oxide semiconductor selectivity of at least 6:1.

4. The process according to claim 1 wherein the oxide semiconductor comprises IGZO or ITZO.

5. The process according to claim 1 wherein the layer comprising molybdenum or titanium further comprises a layer of aluminum or a layer of copper on the layer of molybdenum or titanium on the layer of oxide semiconductor.

6. The process of claim 5, wherein the layer comprising molybdenum or titanium further comprises a second layer of molybdenum or titanium on the layer of aluminum or on the layer of copper, forming a Mo/Al/Mo sandwich, a Mo/Cu/Mo sandwich, a Ti/Al/Ti sandwich or a Ti/Cu/Ti sandwich.

* * * * *